United States Patent [19]

Sadigh-Behzadi

[11] Patent Number: 4,718,863
[45] Date of Patent: Jan. 12, 1988

[54] JUMPER CABLE HAVING CLIPS FOR SOLDER CONNECTIONS

[75] Inventor: Amir-Akbar Sadigh-Behzadi, Van Nuys, Calif.

[73] Assignee: Thomas & Betts Corporation, Raritan, N.J.

[21] Appl. No.: 859,105

[22] Filed: May 2, 1986

[51] Int. Cl.⁴ .............................................. H01R 9/07
[52] U.S. Cl. .................................. 439/496; 439/876
[58] Field of Search ............ 339/17 F, 176 MF, 17 R, 339/17 C, 17 LC, 275 R, 275 C; 174/117 F, 117 FF

[56] References Cited

U.S. PATENT DOCUMENTS

| | | | |
|---|---|---|---|
| 2,457,831 | 1/1949 | O'Brien | 173/334.1 |
| 3,102,767 | 9/1963 | Schneck | 339/176 |
| 3,138,675 | 6/1964 | Krone | 339/17 LC |
| 3,319,216 | 12/1967 | McCullough | 339/176 |
| 3,401,369 | 9/1968 | Palmateer et al. | 339/17 LC |
| 3,601,755 | 8/1971 | Shiells | 339/17 R X |
| 3,728,661 | 4/1973 | Hassabyi | 339/17 F |
| 3,806,767 | 4/1974 | Lehrfeld | 317/101 |
| 3,920,301 | 11/1975 | Roberts et al. | 339/17 |
| 3,997,229 | 12/1976 | Narozny et al. | 339/19 |
| 4,064,622 | 12/1977 | Morris et al. | 29/625 |
| 4,187,606 | 2/1980 | Sinclair | 29/629 |
| 4,556,276 | 12/1985 | Curtis, III | 339/258 |
| 4,602,316 | 7/1986 | Flick | 174/117 F X |

FOREIGN PATENT DOCUMENTS 5013372 5/1977 Japan .

Primary Examiner—Eugene F. Desmond
Attorney, Agent, or Firm—Robert M. Rodrick; Salvatore J. Abbruzzese

[57] ABSTRACT

A flat multiconductor jumper cable comprises a plurality of elongate substantially parallel and transversely spaced conductors surrounded by a casing of insulation. At one or both ends of the jumper cable, exposed portions of the conductors are formed in a curved clipped portion for solder connection to an integrated circuit substrate. The conductors are preferably formed of a soft non-resilient material such as copper and the clip portion is provided to have a substantially circular cross-section. The clip portion, formed in a generally U-shaped configuration defines a pocket for receipt therein of the edge of a substrate having conductive pads on opposing surfaces. Upon soldering the clip portion to the conductive pads, solder fillets are formed in such a manner as to provide an enhanced electrical and mechanical joint.

4 Claims, 5 Drawing Figures

JUMPER CABLE HAVING CLIPS FOR SOLDER CONNECTIONS

FIELD OF THE INVENTION

The present invention relates to an electrical multiconductor jumper cable and more particularly to a jumper cable that is adapted to make surface mount connections.

BACKGROUND OF THE INVENTION

It is often desirable to interconnect printed electrical circuit boards or other substrates containing discrete components or semiconductor devices thereon. These printed circuit boards or substrates are generally rectangular and are frequently formed of fiberglass, ceramic, sapphire, or glass films. Arranged around the outer edges of these substrates are typically a number of conductive contact pads in the form of conducting film that are spaced from each other, these conducting films being electrically connected to the components on the substrate.

One common technique of providing electrical connection between such substrates is by an electrical jumper of the type shown in U.S. Pat. No. 3,601,755 issued to James F. Shiells, Jr., on Aug. 24, 1971. This jumper cable comprises a plurality of conductors encased in insulation, each conductor having a straight pin-like section extending from the insulation and serving as a contact element. Holes are typically provided in the contact pads on the substrate edges into which the pin-like conductor ends of the jumper cable are inserted and subsequently soldered. Another known technique of interconnecting electrical substrates is shown in Japanese Patent Application No. 50-133720 filed by Sharp K.K., wherein the ends of the jumper cable are formed to provide a pressure contact to the conductive pads on the substrate. A further technique of interconnecting electrical substrates is shown in U.S. Pat. No. 4,556,276, issued to Hazen Curtis, III on May 6, 1983, which is of the type having a clip portion for resilient connection and subsequent soldering to the conductive pads of a first substrate and a straight stem portion for insertion into holes in the conductive pads of another substrate.

While these techniques and others have been suitable for particular applications, there is a continuing need to improve the interconnections of printed circuit boards and the like, in particular, in the area of surface mount applications while providing reliability and flexibility of the designs.

SUMMARY OF THE INVENTION

It is a primary object of the present invention to provide an improved multiconductor jumper cable.

It is another object of the present invention to provide an improved multiconductor jumper cable for surface mount connections to a substrate or the like.

In accordance with a preferred embodiment of the invention, a multiconductor jumper cable for solder connection to opposing surfaces of an electrical component comprises a plurality of elongate, transversely spaced conductors surrounded by a casing of insulation. Each conductor includes an integral clip portion extending outwardly from the casing, each clip portion having a substantially circular cross-section and having a generally U-shaped configuration. The clip portion has two opposing legs that define a pocket for receipt therein of the electrical component. The clip portion legs are adapted for engaging opposing surfaces of the electrical component.

In a particularly configured form of the invention, the clip portion has a curved bridging portion joining the two legs. The legs define a throat of the pocket that has a spacing less than the spacing of the legs in the interior of the pocket adjacent the bridging portion.

DETAILED DESCRIPTION OF THE PREFERRED EMBODIMENT

Figure 1:
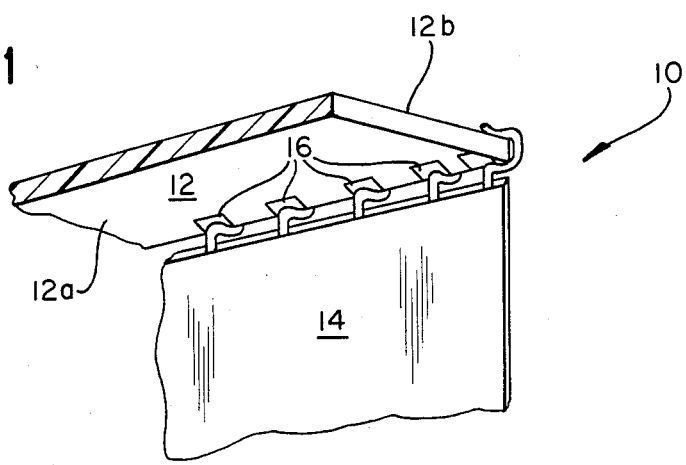
FIG. 1 is a perspective view of a fragmented portion of an integrated circuit substrate showing a jumper cable of the present invention soldered thereto.

Turning now to the drawing, there is shown in FIG. 1 a substrate assembly 10 which includes an integrated substrate 12 and a multiconductor jumper cable 14 soldered thereto. Substrate 12 is formed of an insulative material that may comprise ceramic, fiberglass or other known materials used for supporting integrated circuits. The substrate 12 comprises a plurality of conductive pads 16 conventionally applied to the substrate adjacent its edges conductive pads 16 being suitably spaced from each other. Pads 16 are disposed on both opposing surfaces 12a and 12b of the substrate 12.

Figure 2:
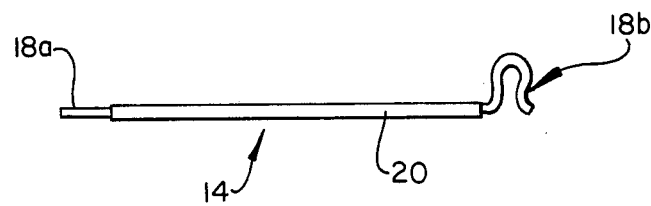
FIG. 2 is a side elevation view of the jumper cable of the present invention in accordance with a particular embodiment.
Figure 3:
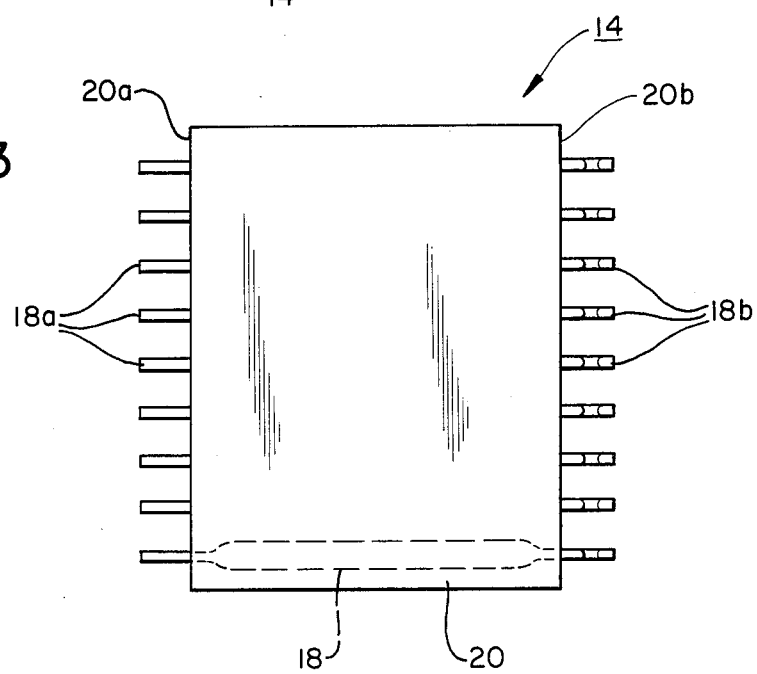
FIG. 3 is a top plan view of the jumper cable of FIG. 2 showing one of the conductors in phantom view.

Turning now to FIGS. 2 and 3, the details of the multiconductor jumper cable may be more fully understood. Cable 14 comprises a plurality of elongate electrical conductors 18 extending substantially parallel to and transversely spaced from each other. The conductors are fully surrounded by an insulative casing 20, such as polyester or other suitable insulative material. In the preferred form, the portions of the conductors 18 that lie interiorly of the insulative casing 20 are flattened in a manner to increase the flexibility of the jumper cable. In the preferred embodiment, the insulative casing 20 is laminated onto the conductors 18. The flattened portions are preferably formed in a manner as set forth in commonly assigned, above-mentioned U.S. Pat. No. 3,601,755.

Projecting outwardly from one side 20a of the insulative casing and integrally formed with the conductors 18 are pin-like contacts 18a. Projecting outwardly from the other side 20b of the insulative casing and integrally formed with the conductors 18 are curved clipped portions 18b. In the preferred form, the electrical conductors inclusive of the pin-like contacts 18a and the clip portions 18b are formed of copper or other suitable non-resilient metal. The exposed contacts 18a and clip portions 18b are also suitably coated with a tin plating although other materials such as gold may be suitably placed thereon. In accordance with the invention, the curved clip portions 18b are formed to have a substantially circular cross section, the purpose and benefits of which will be hereinafter described. It should also be understood, that while in the particular embodiment described herein the jumper cable includes straight pin-like contacts 18a, the jumper cable 14 may also include curved clipped portions 18b on both ends of the cable 14.

Figure 4:
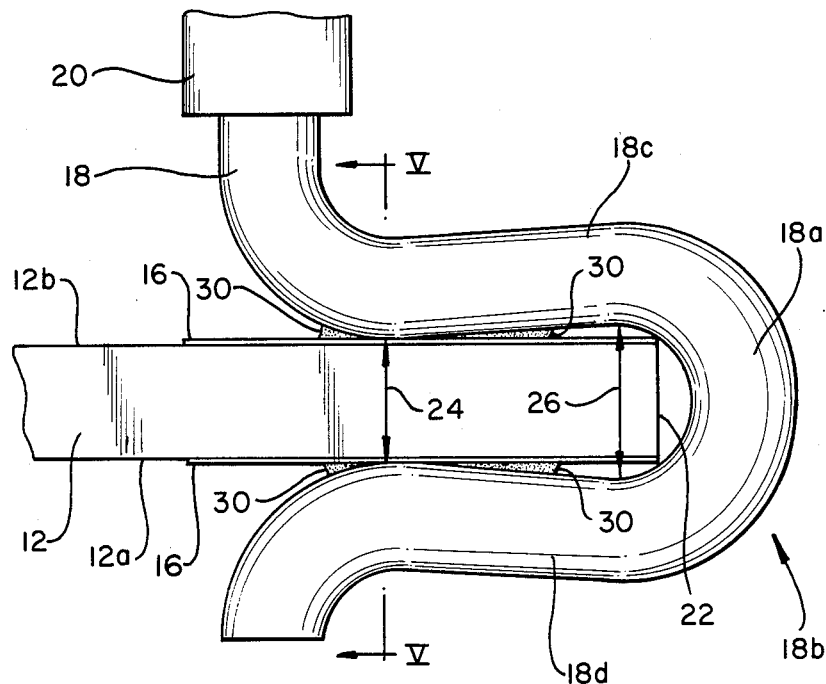
FIG. 4 is an enlarged fragmentary view of the clip portion of the jumper cable showing the details of the solder connection to the integrated circuit substrate.

Referring further now to FIG. 4, the details of the curved clipped portion 18b may be more fully understood. Each clip portion 18b comprises a generally U-shaped configuration having opposing legs 18c and 18d. The legs of the U-shaped configuration are integrally joined by a curved bridging portion 18e. As illustrated in FIG. 4, the legs 18c and 18d and the bridging portion 18d define a pocket 22 for receipt of the edge portion of the substrate 12 therein. At the open end of the pocket 22, the opposing legs 18c and 18d define a throat 24 where the legs 18c and 18d are spaced closer together than the legs 18c and 18d at a location 26 near the bottom of the pocket 22 adjacent the bridging portion 18e. The spacing of the throat 24 is configured to provide an initial interference fit with the substrate 12 during insertion into the pocket 22.

Figure 5:
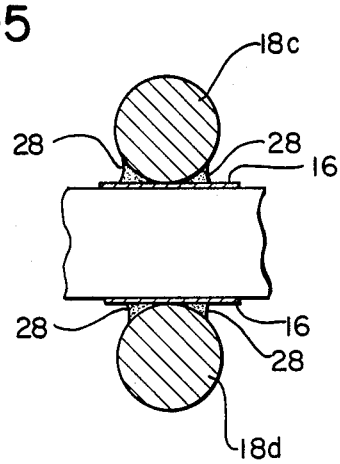
FIG. 5 is a cross-sectional view of the solder connection of FIG. 4 as seen along viewing lines V—V.

Referring now to FIGS. 4 and 5 the details of the soldered interconnection to the substrate 12 are provided. During insertion of the substrate 12 into the pocket 22, the conductive pads 16 on the opposing surfaces 12a and 12b of the substrate engage the opposing legs 18c and 18d and slide therealong until the edge of the substrate 12 bottoms out in the pocket 22. As the material of the clip portion 18b is made of relatively soft copper and is relatively non-resilient, while the initial engagement of the legs 18c and 18d against the conductive pads 16 on the substrate may be in an interference fit, the legs 18c and 18d will not provide a sufficient enough resilient force for an electrical pressure connection. There will be enough force however to position the clip portions 18 on the substrate and hold the clips thereon for subsequent soldering. As the clip portion is precoated with a layer of tin or other suitable material, solder connection is readily provided by a vapor phase soldering, reflow soldering or other conventional technique of soldering to form a permanent joint.

Due to the fact that the clip portion 18b is formed of a substantially circular cross section, as seen in FIG. 5, solder will form a fillets 28 on both sides of the contact points of the legs 18c and 18d to the conductive pads 16. Also, as illustrated in FIG. 4, as the spacing 26 at the bottom of the pocket 22 between the legs 18c and 18d is greater than the spacing of the throat 24, solder fillets 30 will be formed on both sides of the contact points that the legs 18c and 18d form with the conductive pads 16 at the throat 24.

The double solder fillets 28 and 30 result in an electrical connection that is highly reliable. In addition to providing a good electrical connection, mechanical connection is also enhanced in such a manner that the solder joint closest of the insulative casing 20 is believed to provide a strain relief for the conductors 18. Such strain relief allows for greater bending adjacent the solder joint than a connection normally provided by a straight pin-like contact. Also, as the clipped portions are not intended to provide a pressure electrical connection, but rather to serve as a positioning and holding means for subsequent soldering, the conductors 18 may be formed of the relatively soft copper material which as described hereinabove is advantageous in being able to provide a flexible jumper cable that has flattened sections interiorly of the casing 20.

Having described the preferred embodiment of the invention herein, it should be appreciated that various modifications thereof may be made within the contemplated scope of the invention. Accordingly, the preferred embodiment described herein is provided in an illustrative rather than a limiting sense. The true scope of the invention is set forth in the following claims.

I claim:

1. A multiconductor jumper cable for solder connection to opposing surfaces of an electrical component, comprising:

a plurality of elongate, transversely spaced conductors surrounded by a casing of insulation, each of said conductors being formed of a substantially non-resilient metal, each conductor including an integral clip portion extending outwardly from said casing, each clip portion having a substantially circular cross-section and having a generally U-shaped configuration formed by two spaced legs connected by a curved bridging portion, said U-shaped configuration defining a pocket for receipt therein of said electrical component, said legs being spaced for engaging opposing surfaces of said electrical component upon receipt of said electrical component and for contacting said opposing surfaces thereof with sufficient force to hold said clip onto said electrical component but with insufficient force to provide an electrical pressure connection thereto, the engagement locations of said legs defining a throat of said pocket that has a spacing less than the spacing of said legs in the interior of said pocket adjacent said bridging portion.

2. A cable according to claim 1, wherein said metal is copper.

3. A cable according to claim 2, wherein said clip portions are each covered with a layer of different metal.

4. A cable according to claim 2, wherein said conductors within said casing each comprise a generally flattened portion.

* * * * *